(12) United States Patent
Tong et al.

(10) Patent No.: US 12,182,352 B2
(45) Date of Patent: Dec. 31, 2024

(54) TOUCH PANELS AND DISPLAY APPARATUSES

(71) Applicants: Chengdu BOE Optoelectronics Technology Co., Ltd., Sichuan (CN); BOE Technology Group Co., Ltd., Beijing (CN)

(72) Inventors: Kemeng Tong, Beijing (CN); Fan He, Beijing (CN); Cong Fan, Beijing (CN); Yu Wang, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/794,826

(22) PCT Filed: May 31, 2021

(86) PCT No.: PCT/CN2021/097336
§ 371 (c)(1),
(2) Date: Jul. 22, 2022

(87) PCT Pub. No.: WO2022/252033
PCT Pub. Date: Dec. 8, 2022

(65) Prior Publication Data
US 2024/0192796 A1    Jun. 13, 2024

(51) Int. Cl.
*G06F 3/041* (2006.01)
*G06F 3/044* (2006.01)
*H10K 59/40* (2023.01)

(52) U.S. Cl.
CPC ........ *G06F 3/04164* (2019.05); *G06F 3/0412* (2013.01); *G06F 3/0446* (2019.05); *H10K 59/40* (2023.02); *G06F 2203/04107* (2013.01)

(58) Field of Classification Search
CPC .. G06F 3/04164; G06F 3/0446; G06F 3/0412; G06F 2203/04107; H10K 59/40
See application file for complete search history.

(56) References Cited

U.S. PATENT DOCUMENTS 10,459,562 B2 * 10/2019 Wang .................... G06F 3/0443
11,144,168 B1    10/2021 Lin
(Continued)

FOREIGN PATENT DOCUMENTS

CN      102622114 A    8/2012
CN      203133434 U    8/2013
(Continued)

OTHER PUBLICATIONS

PCT/CN2021/097336 international search report.
PCT/CN2021/097336 Written Opinion.

*Primary Examiner* — Afroza Chowdhury
(74) *Attorney, Agent, or Firm* — IPro, PLLC

(57) ABSTRACT

Disclosed are a touch panel and a display apparatus. The touch panel includes: a base substrate (1) including a touch area (101) and a peripheral area (102) surrounding the touch area (101); a touch electrode (2) provided in the touch area (101); a touch signal line provided in the peripheral area (102) and including a touch sensing signal line (4) and a touch driving signal line (7), the touch sensing signal line (4) and the touch driving signal line (7) being both electrically connected with the touch electrode (2); and a first guard line (3) provided in the peripheral area (102), located between the touch sensing signal line (4) and the touch driving signal line (7), and separated from the touch sensing signal line (4) and from the touch driving signal line (7), where a distance between the first guard line (3) and the touch sensing signal line (4) is less than a width of the first guard line (3), and/or a distance between the first guard line (3) and the touch
(Continued)

driving signal line (7) is less than the width of the first guard line (3), which can prevent a large capacitance value in the touch area (101).

20 Claims, 1 Drawing Sheet

(56) References Cited

U.S. PATENT DOCUMENTS

| | | |
|---|---|---|
| 2015/0160756 A1 | 6/2015 | Polishchuk |
| 2015/0220173 A1 | 8/2015 | Lu et al. |
| 2015/0309625 A1 | 10/2015 | Huang et al. |
| 2016/0291769 A1 | 10/2016 | Wang |
| 2022/0206606 A1* | 6/2022 | Ye .......................... G06F 3/0443 |

FOREIGN PATENT DOCUMENTS

| | | |
|---|---|---|
| CN | 103353818 A | 10/2013 |
| CN | 104698711 A | 6/2015 |
| CN | 105022525 A | 11/2015 |
| CN | 105824448 A | 8/2016 |
| CN | 111930256 A | 11/2020 |
| CN | 112114702 A | 12/2020 |
| CN | 112732127 A | 4/2021 |

* cited by examiner

TOUCH PANELS AND DISPLAY APPARATUSES

CROSS-REFERENCE TO RELATED APPLICATIONS

The present disclosure is the U.S. national phase of PCT Application No. PCT/CN2021/097336 filed on May 31, 2021, which is incorporated herein by reference in its entirety.

TECHNICAL FIELD

The present disclosure relates to the field of display technology, and in particular to a touch panel and a display apparatus.

BACKGROUND

Touch technology mainly includes resistive touch technology, capacitive touch technology and infrared optical touch technology. The capacitive touch technology is responsive and is widely used in smartphones and tablet PCs. A touch panel applying the capacitive touch technology may be provided with a touch electrode, a touch signal line and a touch chip. The touch signal line may be electrically connected between the touch electrode and the touch chip for signal transmission. However, existing capacitive touch panels are prone to have large capacitance values in touch areas.

SUMMARY

An objective of the present disclosure is to provide a touch panel and a display apparatus capable of preventing a large capacitance value in a touch area.

According to an aspect of the present disclosure, there is provided a touch panel including:
  a base substrate including a touch area and a peripheral area surrounding the touch area;
  a touch electrode provided in the touch area;
  a touch signal line provided in the peripheral area and including a touch sensing signal line and a touch driving signal line, the touch sensing signal line and the touch driving signal line being both electrically connected with the touch electrode; and
  a first guard line provided in the peripheral area, located between the touch sensing signal line and the touch driving signal line, and separated from the touch sensing signal line and from the touch driving signal line, where a distance between the first guard line and the touch sensing signal line is less than a width of the first guard line, and/or a distance between the first guard line and the touch driving signal line is less than the width of the first guard line.

Further, the distance between the first guard line and the touch sensing signal line is greater than or equal to an electrostatic safety distance, and/or the distance between the first guard line and the touch driving signal line is greater than or equal to the electrostatic safety distance.

Further, the electrostatic safety distance is 4 μm.

Further, the width of the first guard line is 23 μm to 31 μm.

Further, a portion of the touch sensing signal line and a portion of the touch driving signal line are arranged in parallel, and the first guard line is arranged between the portion of the touch sensing signal line and the portion of the touch driving signal line that are arranged in parallel.

Further, the peripheral area includes a bonding area separated from the touch area, and the portion of the touch sensing signal line and the portion of the touch driving signal line that are arranged in parallel are each located between the bonding area and the touch area.

Further, the touch electrode is strip-shaped, and includes a touch driving electrode and a touch sensing electrode that are arranged to intersect with each other, the touch driving signal line includes a first touch driving signal line and a second touch driving signal line, and opposite ends of the touch driving electrode are electrically connected with the first touch driving signal line and the second touch driving signal line in a one-to-one correspondence; and
  the portion of the touch sensing signal line and a portion of the first touch driving signal line are arranged in parallel.

Further, the touch sensing electrode extends in a first direction, and the touch driving electrode extends in a second direction intersecting with the first direction: the peripheral area includes a bonding area separated from the touch area in the second direction, and the first touch driving signal line is located between the bonding area and the touch area, and is electrically connected with an end of the touch driving electrode close to the bonding area.

Further, the second touch driving signal line is electrically connected with an end of the touch driving electrode away from the bonding area, and the touch panel further includes:
  a second guard line provided in the peripheral area and located between the touch area and the second touch driving signal line.

Further, the touch electrode is strip-shaped, and includes a touch driving electrode and a touch sensing electrode that are arranged to intersect with each other, the touch driving signal line includes a first touch driving signal line and a second touch driving signal line, and opposite ends of the touch driving electrode are electrically connected with the first touch driving signal line and the second touch driving signal line in a one-to-one correspondence; the first guard line is located between the touch sensing signal line and the first touch driving signal line; and the touch panel further includes:
  a second guard line provided in the peripheral area, located between the first touch driving signal line and the second touch driving signal line, and separated from the first touch driving signal line and from the second touch driving signal line, where a distance between the second guard line and the first touch driving signal line is less than a width of the second guard line, and/or a distance between the second guard line and the second touch driving signal line is less than the width of the second guard line.

Further, the base substrate includes:
  a base;
  a light-emitting layer provided on the base; and
  an encapsulation layer provided on a side of the light-emitting layer away from the base,
  where the touch electrode and the touch signal line are both provided on a surface of the encapsulation layer away from the light-emitting layer.

According to an aspect of the present disclosure, there is provided a display apparatus including the above touch panel.

With the touch panel and display apparatus according to the present disclosure, the touch driving signal line is electrically connected with the touch electrode to output a touch driving signal to the touch electrode, and the touch sensing signal line is electrically connected with the touch electrode to receive a touch sensing signal. The first guard line is located between the touch sensing signal line and the touch driving signal line, and the width of the first guard line is greater than the distance between the first guard line and the touch sensing signal line, while the width of the first guard line is greater than the distance between the first guard line and the touch driving signal line, that is, the width of the first guard line is relatively larger, such that the touch sensing signal in the touch sensing signal line may be isolated from the touch driving signal in the touch driving signal line through the first guard line to prevent a large capacitance value in the touch area.

DESCRIPTION OF REFERENCE SIGNS

Figure 1:
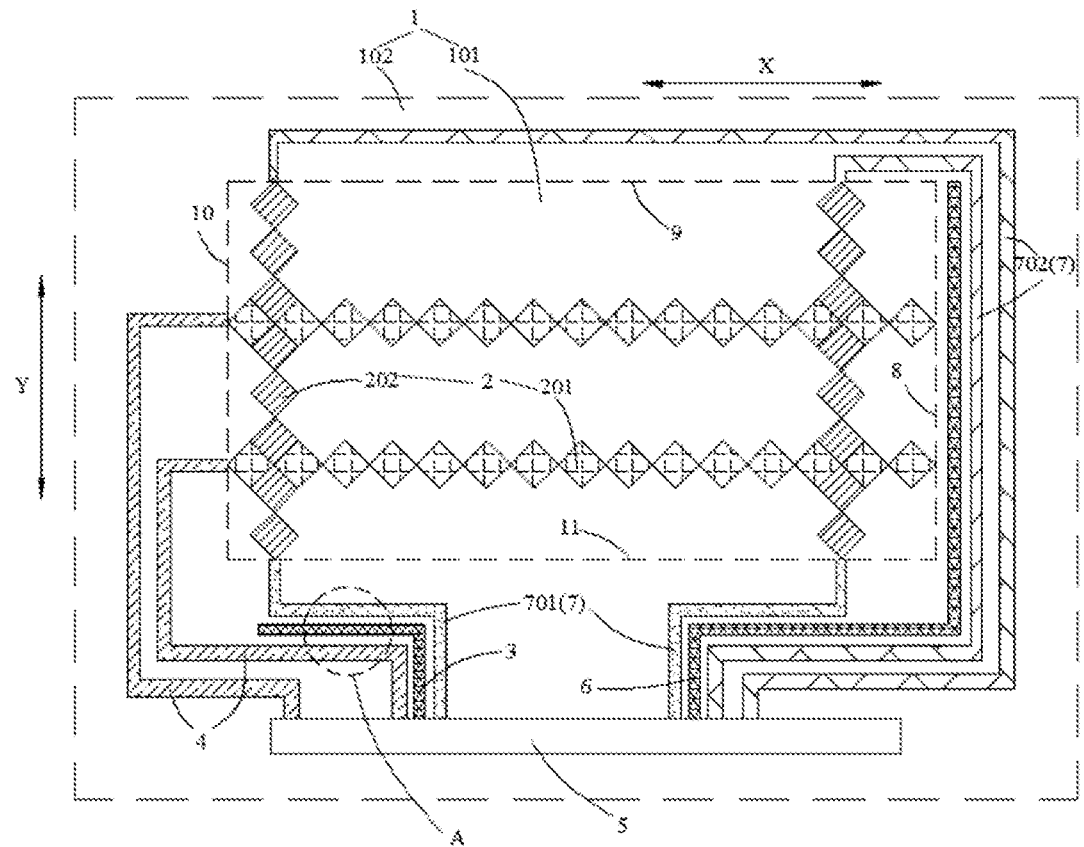
FIG. 1 is a schematic diagram illustrating a touch panel according to an embodiment of the present disclosure.

1: base substrate; 101: touch area; 102: peripheral area; 2: touch electrode; 201: touch sensing electrode; 202: touch driving electrode; 3: first guard line; 4: touch sensing signal line; 5: bonding area; 6: second guard line; 7: touch driving signal line; 701: first touch driving signal line; 702: second touch driving signal line; 8: second side; 9: third side; 10: fourth side; 11: first side.

DETAILED DESCRIPTION

Exemplary embodiments will be described herein in detail, examples of which are illustrated in the drawings. When the following description involves the drawings, like numerals in different drawings refer to like or similar elements unless otherwise indicated. Embodiments described in the following exemplary embodiments do not represent all embodiments consistent with the present disclosure. Rather, they are merely examples of apparatuses consistent with some aspects of the present disclosure as detailed in the appended claims.

The terminology used in the present disclosure is for the purpose of describing particular embodiments only, and is not intended to limit the present disclosure. Unless otherwise defined, technical or scientific terms used in the present disclosure should have ordinary meanings as understood by those ordinary skilled in the art to which the present disclosure belongs. Words "first", "second", and the like, as used in the specification and claims of the present disclosure, do not indicate any sequence, quantity or importance, but are only used to distinguish between different components. Likewise, words "a" or "an" and the like do not indicate any quantity limitation, but rather indicate the presence of at least one. Word "a plurality of" or "several" indicates two or more. Unless otherwise indicated, words such as "front", "rear", "lower" and/or "upper" are for illustrative purposes only, and are not limited to a position or a spatial orientation. Words "include" or "comprise" and the like are intended to refer to that an element or object appearing before "include" or "comprise" covers an element or object listed after "include" or "comprise" and its equivalents, and do not exclude other elements or objects. Words "connect" or "couple" and the like are not limited to a physical or mechanical connection, but may include an electrical connection, whether direct or indirect. As used in the specification and the appended claims of the present disclosure, terms determined by "a", "the" and "said" in their singular forms are intended to include plural forms as well, unless clearly indicated otherwise in the context. It should also be understood that the term "and/or" as used herein refers to and includes any or all possible combinations of one or more of the associated listed items.

Embodiments of the present disclosure provide a touch panel. As shown in FIG. 1, the touch panel may include a base substrate 1, a touch electrode 2, a touch signal line, and a first guard line 3.

The base substrate 1 includes a touch area 101 and a peripheral area 102 surrounding the touch area 101. The touch electrode 2 is provided in the touch area 101. The touch signal line is provided in the peripheral area 102. The touch signal line includes a touch sensing signal line 4 and a touch driving signal line 7. The touch sensing signal line 4 and the touch driving signal line 7 are both electrically connected with the touch electrode 2. The first guard line 3 is provided in the peripheral area 102. The first guard line 3 is located between the touch sensing signal line 4 and the touch driving signal line 7. The first guard line 3 is separated from the touch sensing signal line 4 and from the touch driving signal line 7. A distance between the first guard line 3 and the touch sensing signal line 4 is less than a width of the first guard line 3, and/or a distance between the first guard line 3 and the touch driving signal line 7 is less than the width of the first guard line 3.

With the touch panel according to embodiments of the present disclosure, the touch driving signal line 7 is electrically connected with the touch electrode 2 to output a touch driving signal to the touch electrode 2, and the touch sensing signal line 4 is electrically connected with the touch electrode 2 to receive a touch sensing signal. The first guard line 3 is located between the touch sensing signal line 4 and the touch driving signal line 7, and the width of the first guard line 3 is greater than the distance between the first guard line 3 and the touch sensing signal line 4, while the width of the first guard line 3 is greater than the distance between the first guard line 3 and the touch driving signal line 7, that is, the width of the first guard line 3 is relatively larger, such that the touch sensing signal in the touch sensing signal line 4 may be isolated from the touch driving signal in the touch driving signal line 7 through the first guard line 3 to prevent a large capacitance value in the touch area 101.

Components of the touch panel according to embodiments of the present disclosure will be described in detail below:

As shown in FIG. 1, the base substrate 1 may be used as a support structure of the touch panel. In an embodiment of the present disclosure, the touch panel may be applied to an out-cell touch screen, and the base substrate 1 may be a glass substrate or the like. In another embodiment of the present disclosure, the base substrate 1 may include a base, a drive circuit layer, a light-emitting layer, and an encapsulation layer arranged in a stack. The drive circuit layer may be provided on a side of the base, and the light-emitting layer may be provided on a side of the drive circuit layer away from the base. The drive circuit layer is configured to drive the light-emitting layer to emit light. The drive circuit layer may include a drive transistor. The light-emitting layer may include a display area and a non-display area surrounding the display area. The light-emitting layer may include an anode layer, an organic electroluminescent material layer, and a cathode layer arranged in a stack. The anode layer may be provided on a side of the drive circuit layer and be electrically connected with a source or drain of the drive transistor. The organic electroluminescent material layer may be provided on a side of the anode layer away from the base. The cathode layer may be provided on a side of the organic electroluminescent material layer away from the anode layer. The encapsulation layer may be provided on a side of the cathode layer away from the base. The above-mentioned touch electrode 2 may be disposed on the encapsulation layer. Compared to the out-cell touch screen, disposing the touch electrode 2 on the encapsulation layer may reduce a thickness of the screen without any fit tolerance. The base substrate 1 may include the touch area 101 and the peripheral area 102 surrounding the touch area 101. The touch area 101 may correspond to the display area of the light-emitting layer, and the peripheral area 102 may correspond to the non-display area of the light-emitting layer. The touch area 101 may be square or rectangular in shape, but the present disclosure is not limited thereto, and the touch area 101 may also be circular or oval, etc. in shape. For example, in the case that the touch area 101 is rectangular in shape, the touch area 101 includes a first side 11, a second side 8, a third side 9, and a fourth side 10 sequentially connected with each other. The first side 11 and the third side 9 are arranged opposite to each other and have the same length, and the second side 8 and the fourth side 10 are arranged opposite to each other and have the same length. The length of the first side 11 may be greater than the length of the second side 8; however, the length of the first side 11 may also be smaller than the length of the second side 8. In addition, the peripheral area 102 may be provided with a bonding area 5, and the bonding area 5 may be provided with an external circuit interface. The external circuit interface may be electrically connected with the touch chip. The bonding area 5 may be separated from the touch area 101. The bonding area 5 may be provided on a side of the first side 11 of the touch area 101 away from the third side 9.

As shown in FIG. 1, the touch panel may include a plurality of touch electrodes 2, and each of the touch electrodes 2 is strip-shaped. The plurality of touch electrodes 2 may include a plurality of touch sensing electrodes 201 and a plurality of touch driving electrodes 202. The plurality of touch sensing electrodes 201 all extend in a first direction. The first direction is indicated by X direction in FIG. 1. The plurality of touch driving electrodes 202 all extend in a second direction intersecting with the first direction. That is, the touch sensing electrode 201 and the touch driving electrode 202 are crossed. i.e., the first direction and the second direction intersect with each other. The second direction is indicated by Y direction in FIG. 1. The above-mentioned bonding area 5 and the touch area 101 may be distributed along the second direction. A position where the touch sensing electrode 201 and the touch driving electrode 202 intersect with each other may form a capacitance. By detecting a change in the capacitance, a position of a touch point may be determined. Further, the first direction may be perpendicular to the second direction, that is, the touch sensing electrode 201 may be perpendicular to the touch driving electrode 202. For example, in the case that the touch area 101 is rectangular in shape, the first direction may be parallel to the above-mentioned first side 11, and the second direction may be parallel to the above-mentioned second side 8. In addition, each touch sensing electrode 201 may include a plurality of first touch electrode blocks sequentially connected with each other in the above-mentioned first direction, and each touch driving electrode 202 may include a plurality of second touch electrode blocks sequentially connected with each other in the above-mentioned second direction. The touch electrodes 2 are disposed in the touch area 101. Both ends of each of the strip-shaped touch electrodes 2 extend to boundaries of the touch area 101. For example, in the case that the touch area 101 is rectangular in shape, both ends of the strip-shaped touch sensing electrode 201 extend to the second side 8 and the fourth side 10 in a one-to-one correspondence, and both ends of the strip-shaped touch driving electrode 202 extend to the first side 11 and the third side 9 in a one-to-one correspondence.

As shown in FIG. 1, the touch signal line is provided in the peripheral area 102. The touch signal line includes a touch sensing signal line 4 and a touch driving signal line 7. One end of the touch signal line is electrically connected with the touch electrode 2, and the other end of the touch signal line may be electrically connected with the above-mentioned external circuit interface, so as to receive signals from the touch chip and to transmit signals to the touch chip. One end of the touch driving signal line 7 is electrically connected with the touch driving electrode 202, and the other end of the touch driving signal line 7 is electrically connected with the external circuit interface, so as to receive driving signals from the touch chip. One end of the touch sensing signal line 4 is electrically connected with the touch sensing electrode 201, and the other end of the touch sensing signal line 4 is electrically connected with the external circuit interface, so as to transmit touch sensing signals generated by the touch sensing electrode 201 to the touch chip. In addition, a portion of the touch sensing signal line 4 and a portion of the touch driving signal line 7 are arranged in parallel, so as to improve a density and aesthetics of wiring. The portion of the touch sensing signal line 4 and the portion of the touch driving signal line 7 that are arranged in parallel are each located between the bonding area 5 and the touch area 101.

In an embodiment of the present disclosure, only one end of the touch driving electrode 202 is electrically connected with the touch driving signal line 7, and such a connection is referred to as 1T1R. For example, in the case that the touch area 101 is rectangular in shape, an end of the touch driving electrode 202 extending to the first side 11 is electrically connected with the touch driving signal line 7. In addition, an end of the touch sensing electrode 201 extending to the fourth side 10 is electrically connected with the touch sensing signal line 4.

In another embodiment of the present disclosure, the touch driving signal line 7 includes a first touch driving signal line 701 and a second touch driving signal line 702. One end of the touch driving electrode 202 is electrically connected with the first touch driving signal line 701, the other end of the touch driving electrode 202 is electrically connected with the second touch driving signal line 702, and the first touch driving signal line 701 and the second touch driving signal line 702 are both electrically connected with the above-mentioned external circuit interface, and such a connection is referred to as 2T1R. For example, in the case that the touch area 101 is rectangular in shape, an end of the touch driving electrode 202 extending to the first side 11 is electrically connected with the first touch driving signal line 701, and an end of the touch driving electrode 202 extending to the third side 9 is electrically connected with the second touch driving signal line 702. An end of the touch sensing electrode 201 extending to the fourth side 10 is electrically connected with the touch sensing signal line 4. In addition, in the case that a portion of the touch sensing signal line 4 and a portion of the touch driving signal line 7 are arranged in parallel, for example, the portion of the touch sensing signal line 4 and a portion of the first touch driving signal line 701 are arranged in parallel. The portion of the touch sensing signal line 4 and the portion of the first touch driving signal line 701 that are arranged in parallel are each located between the bonding area 5 and the first side 11 of the touch area 101. The portion of the first touch driving signal line 701 and a portion of the second touch driving signal line 702 are also arranged in parallel. The portion of the first touch driving signal line 701 and the portion of the second touch driving signal line 702 that are arranged in parallel are each located between the bonding area 5 and the first side 11 of the touch area 101.

Figure 2:
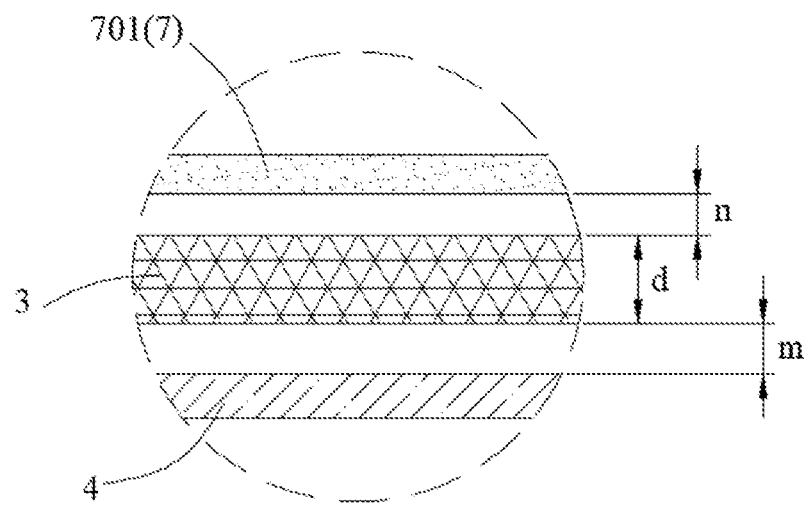
FIG. 2 is an enlarged view illustrating part A in FIG. 1.

The first guard line 3 is provided in the peripheral area 102. The first guard line 3 is located between the touch sensing signal line 4 and the touch driving signal line 7, and the first guard line 3 is separated from the touch sensing signal line 4 and from the touch driving signal line 7. The first guard line 3 may be provided between the portion of the touch sensing signal line 4 and the portion of the touch driving signal line 7 that are arranged in parallel. For example, in the case that the 2T1R connection is used in the present disclosure, the first guard line 3 may be located between the portion of the touch sensing signal line 4 and the portion of the first touch driving signal line 701 that are arranged in parallel. As shown in FIG. 2, the width d of the first guard line 3 may be 23 μm to 31 μm, for example, 23 μm, 25 μm, 26 μm. 27 μm, 28 μm, 29 μm, and 31 μm. In this way, a signal in the touch sensing signal line 4 may be completely isolated from a signal in the touch driving signal line 7, so as to avoid a large capacitance value in the touch area 101. In addition, the first guard line 3 may be electrically connected with the above-mentioned external circuit interface to be connected to a constant power supply terminal. The constant power supply terminal may be grounded, but the present disclosure is not limited thereto.

As shown in FIG. 2, the distance m between the first guard line 3 and the touch sensing signal line 4 is less than the width d of the first guard line 3. Further, the distance between the first guard line 3 and the touch sensing signal line 4 is greater than or equal to an electrostatic safety distance. The electrostatic safety distance refers to a distance that can prevent electrostatic discharge (ESD) from occurring between the first guard line 3 and the touch sensing signal line 4. In other words, when the distance between the first guard line 3 and the touch sensing signal line 4 is greater than or equal to the electrostatic safety distance, no electrostatic discharge (ESD) may occur between the first guard line 3 and the touch sensing signal line 4. The distance n between the first guard line 3 and the touch driving signal line 7 is less than the width of the first guard line 3, that is, the distance between the first guard line 3 and the first touch driving signal line 701 is also less than the width of the first guard line 3. As shown in FIG. 2, the distance m between the first guard line 3 and the touch sensing signal line 4 may be the same as or different from the distance n between the first guard line 3 and the touch driving signal line 7. In addition, the distance between the first guard line 3 and the touch driving signal line 7 is also greater than or equal to the electrostatic safety distance. In this way, electrostatic discharge (ESD) may be prevented from occurring between the first guard line 3 and the touch driving signal line 7. The above-mentioned electrostatic safety distance may be 4 μm, but embodiments of the present disclosure are not limited thereto. The first guard line 3 may be made of metal or the like.

The touch panel according to embodiments of the present disclosure may further include a second guard line 6. The second guard line 6 may be provided in the peripheral area 102, and located between the touch area 101 and the second touch driving signal line 702 to prevent an interaction between the second touch driving signal line 702 and the touch sensing electrodes 201 provided in the touch area 101. In particular, the second guard line 6 may be located between the second side 8 and the second touch driving signal line 702.

The second guard line 6 is also located between the first touch driving signal line 701 and the second touch driving signal line 702, and is separated from the first touch driving signal line 701 and from the second touch driving signal line 702. A distance between the second guard line 6 and the first touch driving signal line 701 is less than a width of the second guard line 6, and a distance between the second guard line 6 and the second touch driving signal line 702 is less than the width of the second guard line 6. The width of the second guard line 6 may be the same as or different from the width of the above-mentioned first guard line 3. The distance between the second guard line 6 and the first touch driving signal line 701 or the second touch driving signal line 702 may also be greater than or equal to the electrostatic safety distance, that is, the distance between the second guard line 6 and the first touch driving signal line 701 or the second touch driving signal line 702 may be greater than or equal to 4 μm. The second guard line 6 may be electrically connected with the above-mentioned external circuit interface to be connected to a constant power supply terminal. The constant power supply terminal may be grounded, but the present disclosure is not limited thereto. The second guard line 6 may be made of metal or the like.

Embodiments of the present disclosure further provide a display apparatus. The display apparatus may include the touch panel according to any one of the above embodiments. The display apparatus may include a wearable display apparatus, such as a watch and glasses, which is not particularly limited in embodiments of the present disclosure. Since the touch panel in the display apparatus according to embodiments of the present disclosure is the same as the touch panel according to the above embodiments of the touch panel, the two have the same beneficial effects, which will not be repeated herein.

The foregoing are merely preferred embodiments of the present disclosure, and do not limit the present disclosure in any form. Although the present disclosure has been disclosed as above in the preferred embodiments, the present disclosure is not limited thereto. Any person skilled in the art may utilize the technical contents disclosed above to make some variations or modifications into equivalent embodiments with equivalent changes, without departing from the scope of the technical solution of the present disclosure. Any simple variations, equivalent changes and modifications made to the above embodiments based on the technical essence of the present disclosure without departing from the contents of the technical solution of the present disclosure shall fall within the scope of the technical solution of the present disclosure.

The invention claimed is:

1. A touch panel, comprising:
 a base substrate comprising a touch area and a peripheral area surrounding the touch area;
 a touch electrode provided in the touch area;
 a touch signal line provided in the peripheral area and comprising a touch sensing signal line and a touch driving signal line, the touch sensing signal line and the touch driving signal line being both electrically connected with the touch electrode; and
 a first guard line provided in the peripheral area, located between the touch sensing signal line and the touch driving signal line, and separated from the touch sensing signal line and from the touch driving signal line, wherein a distance between the first guard line and the touch sensing signal line is less than a width of the first guard line, and/or a distance between the first guard line and the touch driving signal line is less than the width of the first guard line.

2. The touch panel according to claim 1, wherein the distance between the first guard line and the touch sensing signal line is greater than or equal to an electrostatic safety distance, and/or the distance between the first guard line and the touch driving signal line is greater than or equal to the electrostatic safety distance.

3. The touch panel according to claim 2, wherein the electrostatic safety distance is 4 μm.

4. The touch panel according to claim 1, wherein the width of the first guard line is 23 μm to 31 μm.

5. The touch panel according to claim 1, wherein a portion of the touch sensing signal line and a portion of the touch driving signal line are arranged in parallel, and the first guard line is arranged between the portion of the touch sensing signal line and the portion of the touch driving signal line that are arranged in parallel.

6. The touch panel according to claim 5, wherein the peripheral area comprises a bonding area separated from the touch area, and the portion of the touch sensing signal line and the portion of the touch driving signal line that are arranged in parallel are each located between the bonding area and the touch area.

7. The touch panel according to claim 5, wherein
the touch electrode is strip-shaped, and comprises a touch driving electrode and a touch sensing electrode that are arranged to intersect with each other, the touch driving signal line comprises a first touch driving signal line and a second touch driving signal line, and opposite ends of the touch driving electrode are electrically connected with the first touch driving signal line and the second touch driving signal line in a one-to-one correspondence; and
the portion of the touch sensing signal line and a portion of the first touch driving signal line are arranged in parallel.

8. The touch panel according to claim 7, wherein
the touch sensing electrode extends in a first direction, and the touch driving electrode extends in a second direction intersecting with the first direction; and
the peripheral area comprises a bonding area separated from the touch area in the second direction, and the first touch driving signal line is located between the bonding area and the touch area, and is electrically connected with an end of the touch driving electrode close to the bonding area.

9. The touch panel according to claim 8, wherein
the second touch driving signal line is electrically connected with an end of the touch driving electrode away from the bonding area, and
the touch panel further comprises:
a second guard line provided in the peripheral area and located between the touch area and the second touch driving signal line.

10. The touch panel according to claim 1, wherein
the touch electrode is strip-shaped, and comprises a touch driving electrode and a touch sensing electrode that are arranged to intersect with each other, the touch driving signal line comprises a first touch driving signal line and a second touch driving signal line, and opposite ends of the touch driving electrode are electrically connected with the first touch driving signal line and the second touch driving signal line in a one-to-one correspondence;
the first guard line is located between the touch sensing signal line and the first touch driving signal line; and
the touch panel further comprises:
a second guard line provided in the peripheral area, located between the first touch driving signal line and the second touch driving signal line, and separated from the first touch driving signal line and from the second touch driving signal line, wherein a distance between the second guard line and the first touch driving signal line is less than a width of the second guard line, and/or a distance between the second guard line and the second touch driving signal line is less than the width of the second guard line.

11. The touch panel according to claim 1, wherein the base substrate comprises:
a base;
a light-emitting layer provided on the base; and
an encapsulation layer provided on a side of the light-emitting layer away from the base,
wherein the touch electrode and the touch signal line are both provided on a surface of the encapsulation layer away from the light-emitting layer.

12. A display apparatus, comprising a touch panel, wherein the touch panel comprises:
a base substrate comprising a touch area and a peripheral area surrounding the touch area;
a touch electrode provided in the touch area;
a touch signal line provided in the peripheral area and comprising a touch sensing signal line and a touch driving signal line, the touch sensing signal line and the touch driving signal line being both electrically connected with the touch electrode; and
a first guard line provided in the peripheral area, located between the touch sensing signal line and the touch driving signal line, and separated from the touch sensing signal line and from the touch driving signal line, wherein a distance between the first guard line and the touch sensing signal line is less than a width of the first guard line, and/or a distance between the first guard line and the touch driving signal line is less than the width of the first guard line.

13. The display apparatus according to claim 12, wherein the distance between the first guard line and the touch sensing signal line is greater than or equal to an electrostatic safety distance, and/or the distance between the first guard line and the touch driving signal line is greater than or equal to the electrostatic safety distance.

14. The display apparatus according to claim 12, wherein a portion of the touch sensing signal line and a portion of the touch driving signal line are arranged in parallel, and the first guard line is arranged between the portion of the touch sensing signal line and the portion of the touch driving signal line that are arranged in parallel.

15. The display apparatus according to claim 14, wherein the peripheral area comprises a bonding area separated from the touch area, and the portion of the touch sensing signal line and the portion of the touch driving signal line that are arranged in parallel are each located between the bonding area and the touch area.

16. The display apparatus according to claim 14, wherein
the touch electrode is strip-shaped, and comprises a touch driving electrode and a touch sensing electrode that are arranged to intersect with each other, the touch driving signal line comprises a first touch driving signal line and a second touch driving signal line, and opposite ends of the touch driving electrode are electrically connected with the first touch driving signal line and the second touch driving signal line in a one-to-one correspondence; and the portion of the touch sensing signal line and a portion of the first touch driving signal line are arranged in parallel.

17. The display apparatus according to claim 16, wherein the touch sensing electrode extends in a first direction, and the touch driving electrode extends in a second direction intersecting with the first direction; and the peripheral area comprises a bonding area separated from the touch area in the second direction, and the first touch driving signal line is located between the bonding area and the touch area, and is electrically connected with an end of the touch driving electrode close to the bonding area.

18. The display apparatus according to claim 17, wherein the second touch driving signal line is electrically connected with an end of the touch driving electrode away from the bonding area, and the touch panel further comprises:
  a second guard line provided in the peripheral area and located between the touch area and the second touch driving signal line.

19. The display apparatus according to claim 12, wherein the touch electrode is strip-shaped, and comprises a touch driving electrode and a touch sensing electrode that are arranged to intersect with each other, the touch driving signal line comprises a first touch driving signal line and a second touch driving signal line, and opposite ends of the touch driving electrode are electrically connected with the first touch driving signal line and the second touch driving signal line in a one-to-one correspondence;

the first guard line is located between the touch sensing signal line and the first touch driving signal line; and the touch panel further comprises:
  a second guard line provided in the peripheral area, located between the first touch driving signal line and the second touch driving signal line, and separated from the first touch driving signal line and from the second touch driving signal line, wherein a distance between the second guard line and the first touch driving signal line is less than a width of the second guard line, and/or a distance between the second guard line and the second touch driving signal line is less than the width of the second guard line.

20. The display apparatus according to claim 12, wherein the base substrate comprises:
  a base;
  a light-emitting layer provided on the base; and
  an encapsulation layer provided on a side of the light-emitting layer away from the base,
  wherein the touch electrode and the touch signal line are both provided on a surface of the encapsulation layer away from the light-emitting layer.

\* \* \* \* \*